United States Patent
Marsh et al.

(10) Patent No.: US 6,835,969 B1
(45) Date of Patent: Dec. 28, 2004

(54) SPLIT-CHANNEL HIGH ELECTRON MOBILITY TRANSISTOR (HEMT) DEVICE

(75) Inventors: Philbert F. Marsh, Andover, MA (US); Colin S. Whelan, Wakefield, MA (US); William E. Hoke, Wayland, MA (US)

(73) Assignee: Raytheon Company, Waltham, MA (US)

(*) Notice: Subject to any disclaimer, the term of this patent is extended or adjusted under 35 U.S.C. 154(b) by 0 days.

(21) Appl. No.: 10/606,820

(22) Filed: Jun. 26, 2003

(51) Int. Cl.[7] .......................................... M01L 31/0328
(52) U.S. Cl. .................... 257/197; 257/192; 257/194; 257/200; 257/201; 257/205; 257/190; 257/189
(58) Field of Search ................................ 257/192, 194, 257/197, 200, 201, 205, 190, 189

(56) References Cited

U.S. PATENT DOCUMENTS 5,650,642 A * 7/1997 Sawada et al. ............. 257/192
6,448,119 B1 * 9/2002 Onda ........................ 438/172

OTHER PUBLICATIONS

Enoki et al.; "Design and Characteristics of InGaAs/InP Composite–Channel HEFT's;" IEEE Transactions on Electron Devices, vol. 42, No. 8, Aug. 1995; 0018–9383/95; pp. 413–418.

Hoke et al.; "Molecular Beam Epitaxial Growth and Device Performance of Metamorphic High Electron Mobility Transistor Structures Fabriated on GaAs Substrates;" J. Vac. Sci. Technol. B 17(3), May/Jun. 1999; American Vacuum Society; 0734–211X/99/71(3)/1131/5; pp. 1131–1135.

Whelan et al.; "GaAs Metamorphic HEMT (MHEMT): An Attractive Alternative to InP HEMTs for High Performance Low Noise and Power Applications;" 2000 IEEE 0–7803–6320–5–00; pp. 337–340.

delAlamo et al..; "Breakdown in Millimeter–Wave Power InP HEMT's: A Comparison with GaAs PHEMT's;" IEEE Journal of Solid–State Circuits, vol. 34, No. 9, Sep. 1999; 0018–9200/99; pp. 1204–1221.

* cited by examiner

Primary Examiner—Minhloan Tran
Assistant Examiner—Tan Tran
(74) Attorney, Agent, or Firm—Daly, Crowley & Mofford, LLP

(57) ABSTRACT

A transistor structure having an gallium arsenide (GaAs) semiconductor substrate; a lattice match layer; an indium aluminum arsenide (InAlAs) barrier layer disposed over the lattice match layer; an $In_yGa_{1-y}As$ lower channel layer disposed on the barrier layer, where y is the mole fraction of In content in the lower channel layer; an $In_xGa_{1-x}As$ upper channel layer disposed on the lower channel layer, where x is the mole fraction of In content in the upper channel layer and where x is different from y; and an InAlAs Schottky layer on the $In_xGa_{1-x}As$ upper channel layer. The lower channel layer has a bandgap greater that the bandgap of the upper channel layer. The lower channel layer has a bulk electron mobility lower than the bulk electron mobility of the upper channel layer where.

19 Claims, 8 Drawing Sheets

SPLIT-CHANNEL HIGH ELECTRON MOBILITY TRANSISTOR (HEMT) DEVICE

TECHNICAL FIELD

This invention relates to high electron mobility transistor (HEMT) devices, and more particularly to HEMT devices having split-channels.

BACKGROUND

As is known in the art, one type of semiconductor device is a High Electron Mobility Transistor (HEMT). One type of HEMT is a metamorphic HEMT (MHEMT) such as that shown in the cross-section in FIG. 1. The device is constructed by growing crystal compounds containing In, Ga, Al, and As on GaAs wafers. In these devices, electrons are conducted into and out of the device's semiconductor layers by means of ohmic metal contacts. Upon entering the semiconductor layers below the source ohmic metal, electrons are routed to a channel layer consisting of InGaAs. Once in the channel layer, electrons are confined there by virtue of an InAlAs Schottky layer and an InAlAs barrier layer until they again reach the drain ohmic contact. Electrons have an affinity for the channel layer because the electronic properties of the InGaAs and InAlAs are such that electrons are at a lower potential energy when they reside in the InGaAs channel layer. InGaAs cap layers combined with a high-temperature bake, i.e. alloy of the ohmic metal, serve to aid the formation of low-resistance ohmic contacts which aid the entry and exit of electrons to and from the channel layer.

Devices similar to the MHEMT in form and function can also be constructed on InP substrates. The resulting InP HEMTs have similar electrical properties to MHEMTs but are more restricted in terms of material composition design.

As is also known in the art, MHEMTs and similar devices are typically used to amplify electrical signals at frequencies up to approximately 150 GHz. Present challenges include obtaining high efficiency, power, and gain above 60 GHz along with low cost, and design flexibility that allows trade-offs to be made between power density and gain. In order to reduce cost, these devices utilize metamorphic growth technology described in a paper entitled "Molecular beam epitaxial growth and device performance of metamorphic high electron mobility transistor structures fabricated on GaAs substrates' by W. E. Hoke, P. J. Lemonias, J. J. Mosca, P. S. Lyman, A. Torabi, P. F. Marsh, R. A. McTaggart, S. M. Lardizabal, and K. Hetzler, published in the Journal of Vacuum Science and Technology B 17, 1131 (1999). This process allows the fabrication of high indium content channel layers as needed to obtain acceptably high gain above 60 GHz.

Normally, InP substrates must be used to grow devices having channel layers with indium contents near 45–60% as required for acceptable frequency response at mm-wave frequencies. However, the metamorphic growth technology allows the growth of such high indium devices on GaAs substrates, thus reducing wafer breakage and improving manufacturability. Additionally, metamorphic technology allows one to vary the channel indium content upward, for low-power applications, to obtain low noise and high gain at high frequencies or downward to obtain higher power output while sacrificing noise figure as would be done for power amplifier applications.

Power-added efficiency (PAE), is defined as:

$$PAE = \frac{P_{RFout} - P_{RFin}}{P_{DC}} = P_{RFout}\frac{\left(1-\frac{1}{G}\right)}{P_{DC}}$$

where $P_{DC}$ is the DC power drawn by the amplifier, $P_{RFout}$ and $P_{RFin}$ are the amplifier RF output and RF input signal powers respectively, and $$G = \frac{P_{RFout}}{P_{RFin}}$$

is the amplifier power gain. Alternatively, PAE can be defined as:

$$PAE = \frac{\delta(G-1)}{G}$$

where the drain efficiency $\delta$ is defined as:

$$\delta = \frac{P_{RFout}}{P_{DC}}.$$

In order to maximize PAE, it is important to maintain a high gain, well over unity. PAE is typically quoted as a percentage obtained by multiplying the above PAE by 100.

FIG. 2 shows an RF load line (11) overlaying the MHEMT's family of IV curves and the RF power output can be found from:

$$P_{RFout} = \frac{(V_{max} - V_{min})(I_{peak} - I_{min})}{8}.$$

The RF voltage swing, $V_{max}-V_{min}$ and current swing, $I_{peak}-I_{min}$ are limited by the MHEMT's family of curves. Limitations on any of the four $V_{max}$, $I_{min}$, $V_{min}$, and/or $I_{peak}$ will limit RF power output. $V_{min}$ and $I_{peak}$ are constrained to $V_{min}>0$ and $I_{peak}<I_{dpeak}$ as shown in FIG. 2, by the device's on resistance, $R_o n$. In MHEMTs, $V_{max}$ is usually limited by the requirement to set the drain RF load and/or the DC drain bias voltage so that $V_{ds}$ always remains below that which induces a fast, destructive burnout process. It appears that this burnout mechanism is related to the rate of impact ionization in the channel which is proportional to $I_{ds}$ as well as $V_{ds}$. Therefore the value of $V_{ds}$ resulting in burnout, i.e. $V_{burn}$, generally falls as $I_{ds}$ increases. Additionally, depending on the device, $I_{min}$ can sometimes be nonzero due to the inability to pinch off the MHEMT drain current, $I_{ds}$ at a high drain voltage $V_{ds}$. However, for devices containing high channel indium contents such as MHEMTs discussed here, the above burnout mechanism is usually the limiting factor of $V_{max}$.

Technology limitations in ohmic contacts as well as trade-offs inherent in doping dictate a minimum practical value of $R_{on}$. A nonzero $R_{on}$ limits the drain efficiency $\delta$ because it reduces the RF current and voltage swing, and hence $P_{RFout}$ without a proportional reduction in $P_{DC}$. Once the ohmic contacts are optimized, the only way left to further improve $\delta$ is to increase the value of $V_{burn}$ by reducing impact ionization. For a given $V_{ds}$ and device structure, impact ionization can be reduced by increasing the bandgap of the material by reducing the channel layer indium content.

Established PHEMT technologies use approximately 19% indium content in the channel and give approximately 2 dB gain at maximum $P_{RFout}$ at 95 GHz whereas a 53% indium channel MHEMT has shown 5 dB gain at 95 GHz at maximum $P_{RFout}$. Gain is a significant factor in PAE. For example, if the PHEMT and MHEMT had the same drain efficiency δ, then the MHEMT's PAE would twice that of the PHEMT. For instance, at the low gains encountered in 95 GHz PHEMTs, PAE is 0.376 whereas the MHEMT's PAE is 0.688. Furthermore, PHEMT amplifiers show typically 95 GHz PAEs in the range of 13% whereas InP and MHEMT PAEs are 20–24% at 95 GHz. Therefore, it is important to find a device structure that will allow a good compromise between low impact ionization and high gain at high frequencies.

As is also known in the art, conventional InP and metamorphic HEMTs (MHEMTs) use a single channel layer as shown in FIG. 1. Here, electrons flow in a homogenous sheet, i.e. the channel layer which has a uniform composition. While such devices obtain record low noise figures at high frequencies, the high indium content of their channel layers results in power limitations such as high gate current and low burnout voltage threshold ($V_{burn}$) due to the high levels of impact ionization at high values of drain voltage, $V_{ds}$. The solution might appear to be one of simply lowering the indium content of the channel. However, reduced indium content will decrease electron mobility and electron velocity. The result will be reduced gain and efficiency at high frequencies.

As is also known in the art, compromises are possible whereby the indium content is decreased to 40–50% from the 60% channel indium content as used in MHEMTs designed for low noise and small signal applications. One technique used to provide a compromise involves splitting the channel layer into upper and lower channel layer as shown in FIG. 3. In most cases, the upper channel layer consists of $In_xGa_{1-x}As$ where $0.53<x<0.65$ and the lower channel layer is InP. In some cases a portion of the InP channel is doped. Here, the high electron mobility characteristics of the upper channel enables excellent ohmic contacts and high electron velocity in the low electric field region, between gate and source, as shown in FIG. 3. Below the upper channel layer the lower InP channel layer is optimized for high electron velocity transport for high electric fields. In the low field region, the upper channel layer's greater electron affinity confines most of the current in the upper channel layer. In the high field region between the gate and drain, the electrons attain high energies and velocity due to the high electric field. While the material of the upper channel layer allows electrons to obtain high velocity at low electric fields, at high electric fields, the high scattering rate of electrons will cause their velocity to level off or drop in the upper channel. This causes the current path to shift more into the InP in the high field region where the electrons can attain reduced scattering and greater velocity under the high E-field conditions of high field region. InP also offers the benefit of reduced impact ionization relative to InGaAs. The net result is with InP in the lower channel layer the device should obtain a higher net electron velocity giving it improved high-frequency gain. The reduced impact ionization of the lower channel layer will allow such a device to operate at higher $V_{ds}$ and allow higher RF output power than could be obtained with an all $In_xGa_{1-x}As$ with $0.53<x<0.60$.

While making the lower channel from InP appears to be attractive, it presents the problem of growing phosphorus-containing materials which can be difficult in the molecular beam epitaxy (MBE) systems often used for device layer growth. Furthermore, growth of As-containing materials such as the InGaAs upper channel layer on an InP lower channel layer can be complicated because of material quality difficulties transitioning from InP to InGaAs growth. Growth on InP substrates introduces the need for enhanced care to prevent breakage, requires unique via processing relative to GaAs, and allows only a limited variation of indium content in the channel. InP in the device channel can require a redesign of the ohmic metals which had proven reliability and low resistance for all-InGaAs channel devices. Finally, the presence of InP, in the devices' active layers requires special etchants, which complicates the isolation mesa etch process step because InP requires a different etchant than the rest of the As-based materials.

SUMMARY

In accordance with the present invention, a transistor structure is provided having a semiconductor substrate; a barrier layer disposed over the substrate; a lower channel layer disposed on the barrier layer; an upper channel layer disposed on the lower channel layer, such lower channel being of the same material as the upper channel, the upper and lower channels having different mole fractions of an common element used in such upper and lower channel layers; and an Schottky layer on the upper channel layer.

In one embodiment, the lower channel layer has a bandgap greater that the bandgap of the upper channel layer.

In one embodiment, the lower channel layer has a bulk electron mobility lower than the bulk electron mobility of the upper channel layer.

In one embodiment, the substrate comprises GaAs and wherein the upper and lower channel layers comprise InGaAs.

In one embodiment, the upper and lower channel layers include indium.

In accordance with another feature of the invention, a transistor structure is provided. The structure includes a gallium arsenide (GaAs) semiconductor substrate; an indium aluminum gallium arsenide lattice match layer; an indium aluminum arsenide (InAlAs) barrier layer disposed over the lattice-match layer; an $In_yGa_{1-y}As$ lower channel layer disposed on the barrier layer, where y is the mole fraction of In content in the lower channel layer; an $In_xGa_{1-x}As$ upper channel layer disposed on the lower channel layer, where x is the mole fraction of indium content in the upper channel layer and where x is different from y; and an InAlAs Schottky layer on the $In_xGa_{1-x}As$ upper channel layer.

In one embodiment, the lower channel layer has a bandgap greater that the bandgap of the upper channel layer.

In one embodiment, the lower channel layer has an electron mobility lower than the electron mobility of the upper channel layer.

In one embodiment, x is in the range between 0.15 and 0.90 and y is in the range between 0.0 and 0.65.

In one embodiment, x is substantially 0.53 and y is substantially 0.43

Such transistor structure has most of the benefits of the InP split-channel HEMT but uses a GaAs substrate and has a phosphorus-free layer structure. The structure enables the use of indium contents outside the normal range allowed on InP substrates and allows a greater range of indium content relative to devices grown on InP substrates. The split channel (i.e., upper and lower channel layers of the present invention) allows independent optimization of the upper channel layer for excellent electron transport at the low electric field conditions found in the low electric field region between gate and source while performing an independent optimization on the lower channel layer material to obtain optimum electron transport while minimizing impact ionization in regions having a high electric field such as between the gate and drain.

Thus, the device achieves an excellent compromise between these two opposing parameters (i.e., low impact ionization and high gain at high frequencies) while enjoying the low cost and manufacturability afforded by the use of GaAs substrates.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 4:
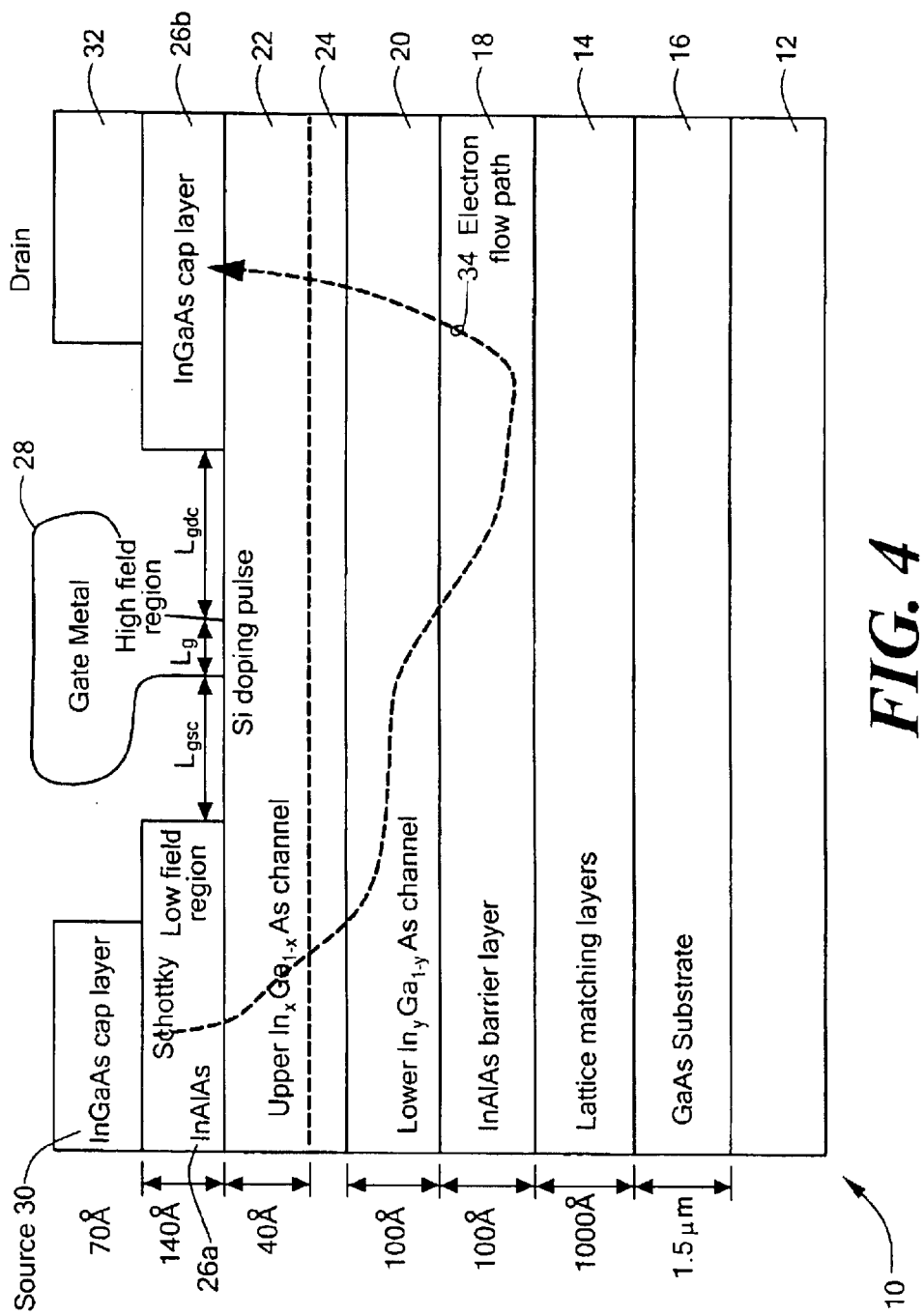
FIG. 4 is a cross-sectional; sketch of a split-channel HEMT device according to the invention.

Referring now to FIG. 4 an MHEMT device structure 10 is shown to include a GaAs semiconductor substrate 12, an InAlAs barrier layer 14, and lattice matching layers 16 between the barrier layer 14 and the substrate 12. Here, the barrier layer 14 is 1000 Angstroms thick.

Disposed on the barrier layer 14 is an $In_yGa_{1-y}As$ lower channel layer 18, where y is the mole fraction of In content in the lower channel layer, where y is in the range of 0.0 to 0.65, here 0.43. Here, the lower channel layer 18 is 100 Angstroms thick.

Disposed on the lower channel layer 18 is an $In_xGa_{1-x}As$ upper channel layer 20, here 100 Angstroms thick, where x is the x is the mole fraction of In content in the upper channel layer and where x is in the range of 0.15 to 0.90, here 0.53 It is noted that x is different from y.

Disposed on the upper channel layer 20 is a Schottky layer 22. The Schottky layer 22 is here 180 Angstroms thick, it being noted that there is a conventional silicon doping spike 24, here 40 Angstroms from the bottom of the Schottky layer 22, as indicated. The bottom 40 Å of the Schottky layer 22 is composed of $In_{0.52}Al_{0.48}As$ while the top 140 Å of the Schottky layer 22 is composed of $In_{0.4}Al_{0.6}As$.

The device structure 10 includes InGaAs cap layers 26a and 26b, here 70 Angstroms thick and silicon doped to $5\times10^8/cm^3$. A gate electrode 28 is in Schottky contact with the Schottky contact layer 22 in a region between the cap layers 26a, 26b. The region has a low field region and a high field region, as indicated. A source electrode 30 is in ohmic contact with the cap layer 26a and a drain electrode 32 is in ohmic contact with cap layer 26b, as indicated. Doping in the cap layers 26a and 26b as well as the doping spike 24 represents the total of the intentional doping of the device.

Dotted arrow 34 represents the path of electron flow between the source and drain electrodes 30, 32 through the upper and lower channel layers 20, 18.

It is noted that the structure uses an GaAs substrate and is phosphorus-free. The resulting device is thereby known as the split-channel metamorphic HEMT (split-channel MHEMT). MHEMT technology allows agreater range of indium content relative to devices grown on InP substrates. The split channel allows independent optimization of the upper channel for excellent electron transport at the low electric field conditions found in the low field region while allowing an independent optimization on the lower channel material to obtain optimum electron transport in regions having a high electric field such as between the gate 28 and InGaAs cap layer 26b. The upper channel layer 20 as noted above contains $In_xGa_{1-x}As$ where x and y are the mole fractions of the indium contents for the respective channels. In the implementation here, the upper channel layer 20 has an indium mole fraction set to x=0.53 while the lower channel layer 18 has y=0.43. This arrangement gives the following calculated material parameters:

TABLE 1

Calculated electrical characteristics of MHEMT channel materials

|  | Indium mole fraction | Bandgap (eV) | Bulk Mobility |
| --- | --- | --- | --- |
| Upper channel layer 20 | 0.53 | 0.74 | 9760 |
| lower channel layer 18 | 0.43 | 0.85 | 8700 |

The larger bandgap of the lower channel layer 18 should reduce impact ionization and hence raise the value of $V_{ds}$ that the MHEMT can reliably withstand. In the low-field region, electron velocity is enhanced by the higher mobility of the upper channel whereas in the high-field region, the reduced impact ionization of the lower channel layer 18 allows higher $V_{ds}$. Electrons are confined in the two channel layers 18, 20 due to the potential barriers formed by the Schottky layer 22 and barrier layer 14 materials. This confinement combined with the small 200 Å combined width of the channel layers 18, 20 results in the electrons' residing at discrete energy levels. Quantum mechanical simulations show that the conduction band of upper channel is 0.1 eV lower in energy than that of the lower channel— indicative of the upper channel layer's 20 higher affinity for electrons relative to the lower channel layer 18. The MHEMT's layer structure 10 is such that the first electron energy level is below the conduction band of the lower channel layer 18. In the low-field region, the conduction bands of the dual channel layer 18, 20 tend to therefore skew the electron distribution toward the upper channel layer 20 and hence, in the low-field region the electronic transport is dominated by the characteristics of the higher indium upper channel layer 20. However, in the high-field region, one can expect the electrons to fill the upper energy levels. These excited electron energy levels e.g. the second and higher energy levels, exceed the 0.1 eV difference in conduction band levels between the upper and lower channel layers 18, 20. Therefore, energetic electrons are able to readily cross to the lower channel layer 18, where they are less likely to contribute to impact ionization and device burnout.

The split-channel MHEMT devices 10 are constructed via the following procedure:

All semiconductor layers are grown using an molecular beam epitaxy system (MBE). First the metamorphic lattice-matching layers 16 are grown on an Epi-ready GaAs wafer (i.e., substrate 12) as described in the article referred to above. For the split-channel MHEMT device 10, the lattice-matching layer 16 begins with a layer of InAlGaAs with a 0.05 mole fraction of indium. The indium content is increased with subsequent InAlGaAs layers while the gallium layer mole fraction is decreased and the aluminum mole fraction held constant. After 4500 Å of these layers, the InAlAs is grown and the In is ramped up in concentration while the Al is ramped down for the next 6000 Å of growth. The lattice match layer technology is also discussed in the paper "Strain Relaxation and Dislocation Filtering in Metamorphic High Electron Mobility Transistor Structures Grown on GaAs Substrates" D. Lubyshev, W. Liu, T. Stewart, A. Cornfeld, X. Fang, X. Xu, P. Specht, C. Kisielowski, M. Naidenkova, M. Goorsky, C. Whelan, W. Hoke, P. Marsh, J. Millunchick, S. Svensson, Journal of Vacuum Science and Technology B 19(4), July/August 2001.

Finally layers having a lattice constant close to that of the channel layers, 18 and 20 are grown starting with the lower $In_{0.52}Al_{0.48}As$ barrier layer 14.

The two channel layers (split channel), i.e., lower channel layer 18 and upper channel layer 20, follow as shown in FIG. 4, and are covered by the 40 Å lower portion of the Schottky layer 22. Here, the 40 Å lower portion of the Schottky layer 22 is $In_{0.52}Al_{0.48}As$. For the upper portion of the InAlAs Schottky layer 22, the aluminum content is then raised to 0.6 fraction giving an $In_{0.4}Al_{0.6}As$ 140 Å Schottky layer. The silicon pulse layer 24 is disposed between the upper and lower portions of the Schottky layer 22.

The Schottky layer's 22 high aluminum content in the upper portion thereof is designed to reduce gate current via the formation of a large energy barrier between gate electrode 28 and channel layers 18, 20 combined with a large Schottky barrier ($\phi_b$) between Schottky layer 22 and the gate metal electrode 28.

After growth of layers, the split-channel MHEMT devices are defined and electrically isolated by performing a mesa etch which removes semiconductor material between the devices down to the layer 16. The ohmic contacts 30, 32 are deposited and alloyed. Next, the gate region is defined and etched to form the region between the layers 26a and 26b using E-beam and optical lithography. The gate electrode 28 metal is then deposited and lifted off to form the gate electrode 28.

It is noted that two channels layer 18 and 20 are provided, i.e., the lower channel $In_yGa_{1-y}As$ layer 18 and the upper channel $In_xGa_{1-x}As$ layer 20 where x and y are the mole fractions of the channels' indium contents and x>y. Further, it is noted that the active device semiconductor layers 18–22 have an average lattice constant different from the lattice constant of InP.

Results

Figure 1:
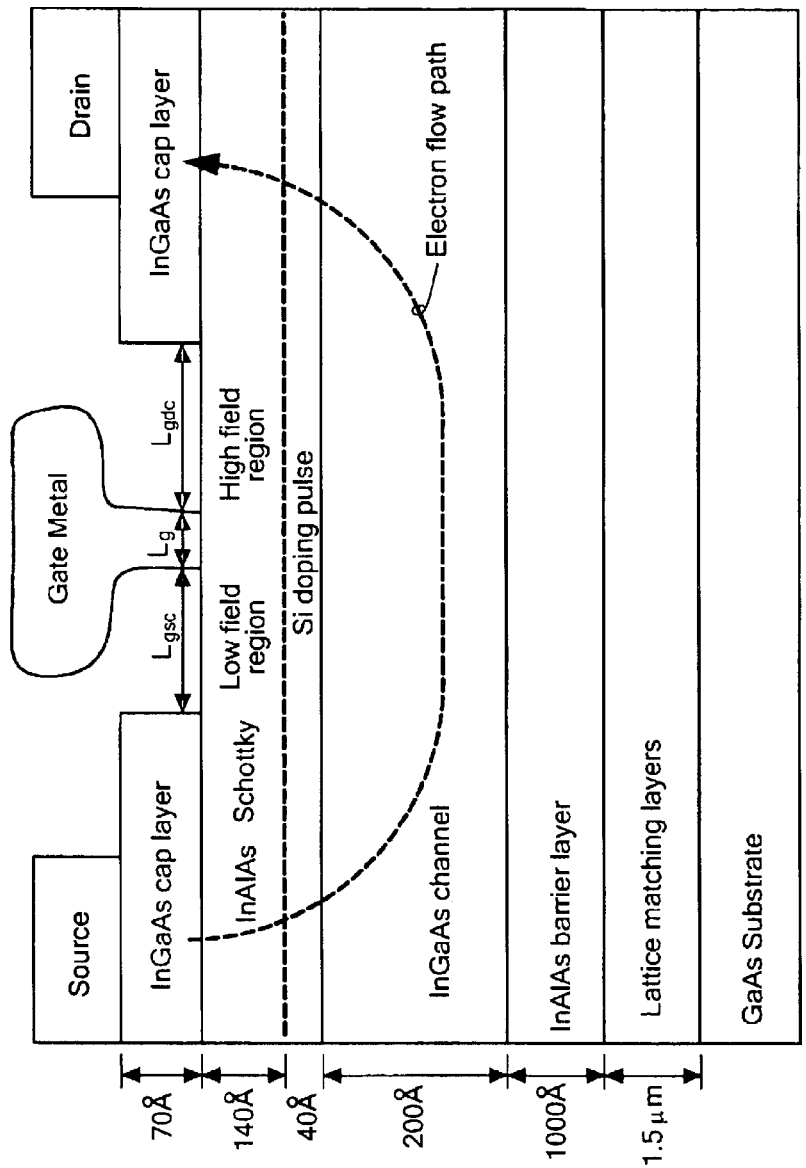
FIG. 1 is a single-channel cross-sectional; sketch of a metamorphic HEMT device according to the PRIOR ART.
Figure 2:
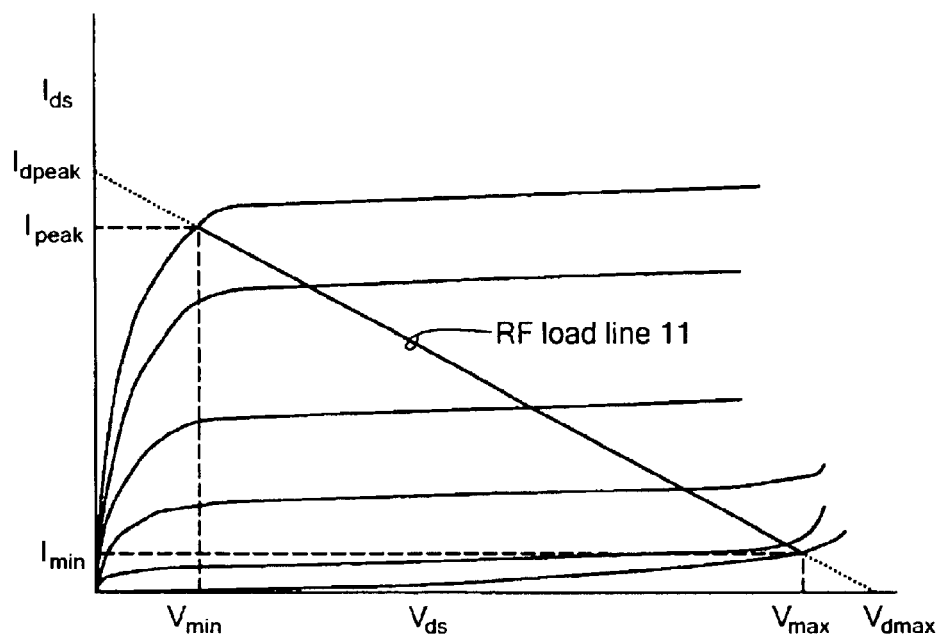
FIG. 2 is a plot showing a family of current-voltage (IV) curves for the device of FIG. 1 according to the PRIOR ART.
Figure 3:
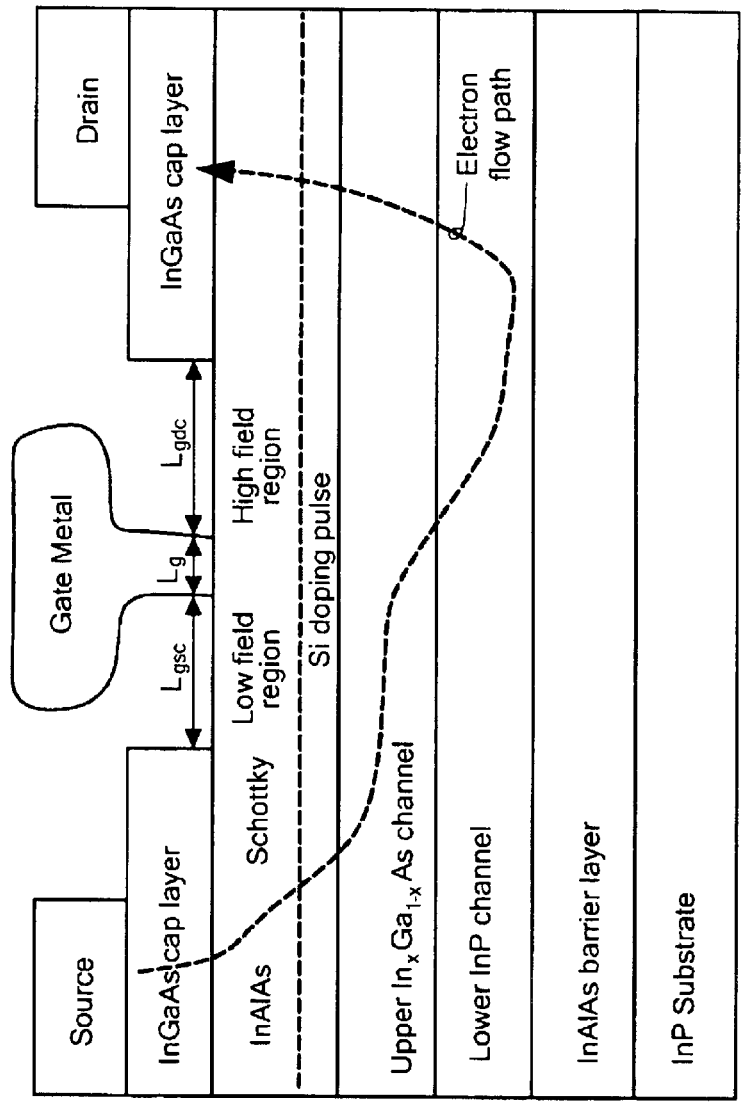
FIG. 3 is a split-channel cross-sectional; sketch of an InP composite-channel HEMT device according to the PRIOR ART.

Several split-channel devices 10 (FIG. 4) and single-channel MHEMTs according to FIG. 1 having gate lengths, $L_g$, of 0.15 μm and a gate periphery of 100 μm were probed on-chip using a 50 Ω wafer probe system. The split-channel MHEMTs devices 10 (FIG. 4) had a 100 Å thick upper channel layer 20 of $In_{0.53}Ga_{0.47}As$ and a 100 Å lower channel layer 18 of $In_{0.43}Ga_{0.57}As$. The single-channel MHEMT had a 200 Å thick $In_{0.53}Ga_{0.47}As$ channel. Hereafter the above MHEMT designs are referred to as 43/53% In MHEMTs and 53% In MHEMTs. Other MHEMTs were tested which were similar to those of FIG. 1 but which had 200 Å thick $In_{0.6}Ga_{0.4}As$ channels. These devices were referred to as 60% In MHEMTs.

In these tests, bias tees, to be described, were used only on the gate circuit. Control of impedance presented to the MHEMT, particularly the gate, is important to prevent undesirable oscillation. The bias tees serve this purpose by isolating the DC and RF signal paths so that the RF signal path on the gate sees 50C loads while the DC gate bias voltage is applied to the device's gate and blocked from the RF 50 Ω load.

Hereafter, all MHEMT current will be listed as normalized to the total gate periphery of one mm e.g. 10 mA/mm means a current of 10 mA for each mm of gate periphery where periphery is the dimension of the gate perpendicular to the current flow and is a measure of device size.

The first test is to measure the MHEMTs' current-voltage family of curves, hereafter known as the IV curves, via an HP4155B parameter analyzer. In this test, the drain current, $I_{ds}$, is plotted as a function of both drain-source voltage, $V_{ds}$, and gate-source voltage, $V_{gs}$. A family of $I_{ds}$ vs. $V_{ds}$ curves is generated by setting $V_{gs}$, sweeping $V_{ds}$ from 0 to 1.5 V and plotting the resulting $I_{ds}$ with $V_{ds}$ held constant. Subsequent curves are generated by stepping $V_{gs}$ by −0.2 V and sweeping $V_{ds}$ to generate the next of a series of curves. This process is repeated from $V_{gs}$=+1V to $V_{gs}$ of −1.1 or −1.2V. Since gate current is limited to 100 μA/mm, the actual $V_{gs}$ will limit somewhere below +1V.

Breakdown and burnout measurements have been used here to evaluate and compare the power output capabilities of three types of MHEMT structures; namely a 53% MHEMT having a 200 Å thick $In_{0.53}Ga_{0.47}As$ channel, (as shown in FIG 1) and a 43/53% MHEMT being a split-channel MHEMT device 10 as in FIG. 4, having an upper 100 Å thick channel layer 20 of $In_{0.53}Ga_{0.47}As$ and a 100 Å thick lower channel layer 18 of $In_{0.43}Ga_{0.57}As$. The 53% and 43/53% MHEMTs devices 10 (FIG. 4) are competing MHEMT designs intended for RF power production above 60 GHz. For comparison, some of the tests included data from MHEMTs similar to the 53% devices but having $In_{0.6}Ga_{0.4}As$ channels and referred to below as 60% MHEMTs.

Figure 5:
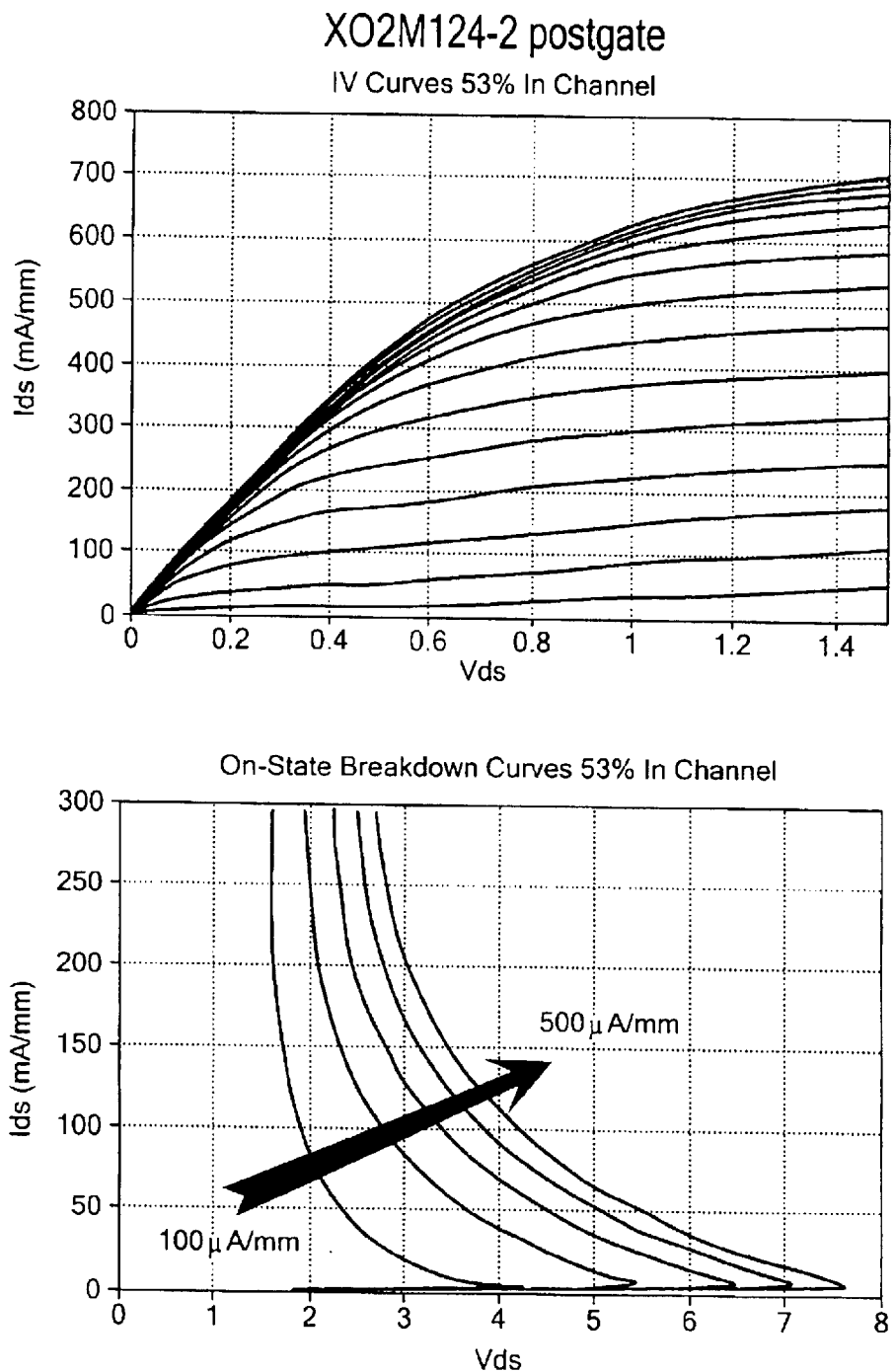
FIGS. 5 and 6, respectively, are a comparison of IV curves (left plot) and on-state breakdown curves (right plot) the device of FIG. 1 according to the PRIOR ART with the device of FIG. 4 according to the invention.
Figure 6:
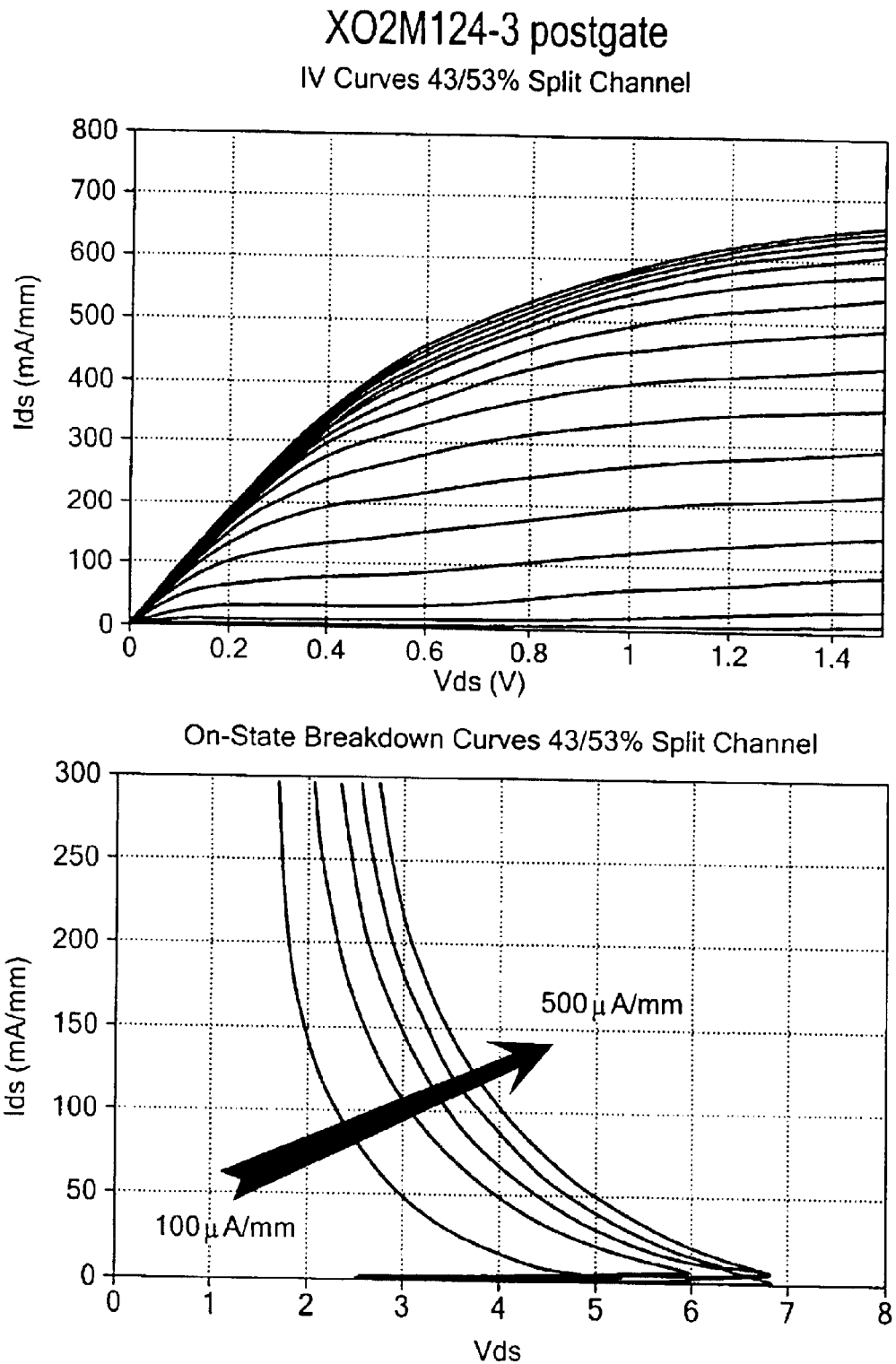

On-state breakdown characteristics can be measured after an MHEMT's operation has been verified via the IV family of curves. On-state breakdown is measured by sweeping $I_{ds}$ from zero to 300 mA/mm by plotting a family of $I_{ds}$ vs. $V_{ds}$ curves. Each curve is plotted at a unique value of reverse gate current, $I_g$; and each different curve of the family is produced by stepping $I_g$ to a new value. Gate current arises principally from two effects namely 1. tunneling and 2. hole current generated by impact ionization in the channel layer. For a given value of $V_{gs}$, $I_g$ is expected to rise as $I_{ds}$ and/or $V_{ds}$ increases because the resulting increase in impact ionization increases hole generation in the channel. Holes are gathered by the gate resulting in a gate current proportional to the hole generation rate. At low $I_{ds}$, one would expect $I_g$ to be dominated by electron tunneling between gate metal 28 and the channel layers 18 and 20. In FIGS. 5 and 6, respectively, 53% and 43/53% split-channel MHEMTs were characterized by plotting their IV curves (left plot) and then their on-state breakdown curves (right plot). For the 53% data, IV and breakdown curves were averaged from four MHEMTs. In FIG. 6, the 43/53% IV curves were averaged for four MHEMTs and their breakdown curves represent averages over two devices. One will notice that while the 53% devices show higher breakdown $V_{ds}$ at low drain currents, for $I_{ds}$>100 mA/mm, the 43/53% devices show an advantage with $V_{ds}$ higher than that of the 53% MHEMTs for a given gate current $I_g$.

Figure 7:
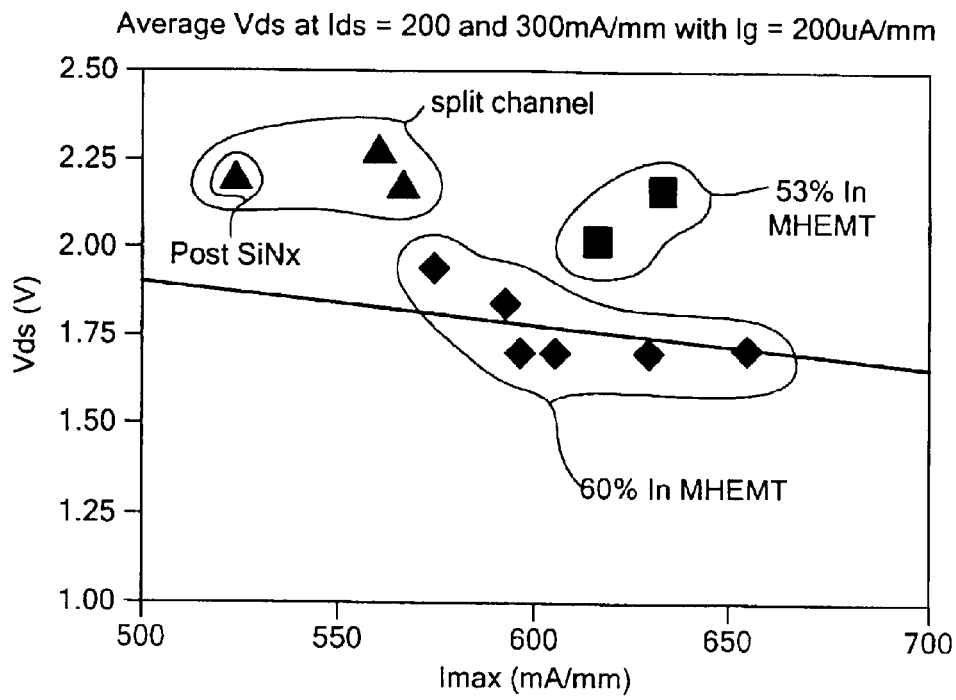
FIG. 7 is the breakdown data of FIGS. 5 and 6 in a more compact format.

FIG. 7 illustrates some of the breakdown data of FIGS. 5 and 6 in a more compact format. In all cases, each data point represents $V_{ds}$ at $I_g$=200 µA/mm for a single device. The $V_{ds}$ value, at each data point, was formed by the average of two $V_{ds}$ values measured at two respective $I_{ds}$ values of 200 and 300 mA/mm with $I_g$=200 µA/mm in all cases. In FIG. 7, the "post SiNx" devices were 43/53% MHEMTs which had been passivated with a silicon nitride coating The 60% In devices, had also been passivationed with a silicon nitride coating while the 53% devices were measured before passivation. FIG. 7 illustrates the expected trends, namely that the split-channel 43/53% MHEMTs show higher on-state breakdown, i.e. higher $V_{ds}$, than the 53% In MHEMTs. Another trend is seen as well, namely that as $I_{max}$ increases $V_{ds}$ at breakdown decreases. This is expected because $I_{max}$ is the maximum value of $I_{ds}$ obtainable in the devices and it is related to the doping. A higher Si pulse doping 24 (FIG. 4) is expected in increase gate reverse current by reducing the effective energy barrier to electrons presented by the Schottky layer 22. Also, higher doping and $I_{max}$ levels act to reduce the gate-drain depletion region width which increases the high field region's electric field for a constant $V_{ds}$. The higher electric field increases impact ionization in the channel regions, i.e., either the single channel layer for the device shown in FIG. 1 or the split channel layer 18, 20 for the device 10 in FIG. 4, while reducing the barrier to gate current flow. These effects lead to a higher gate current for a given $V_{ds}$ or alternatively a lower $V_{ds}$ for a given drain and gate current.

Figure 8:
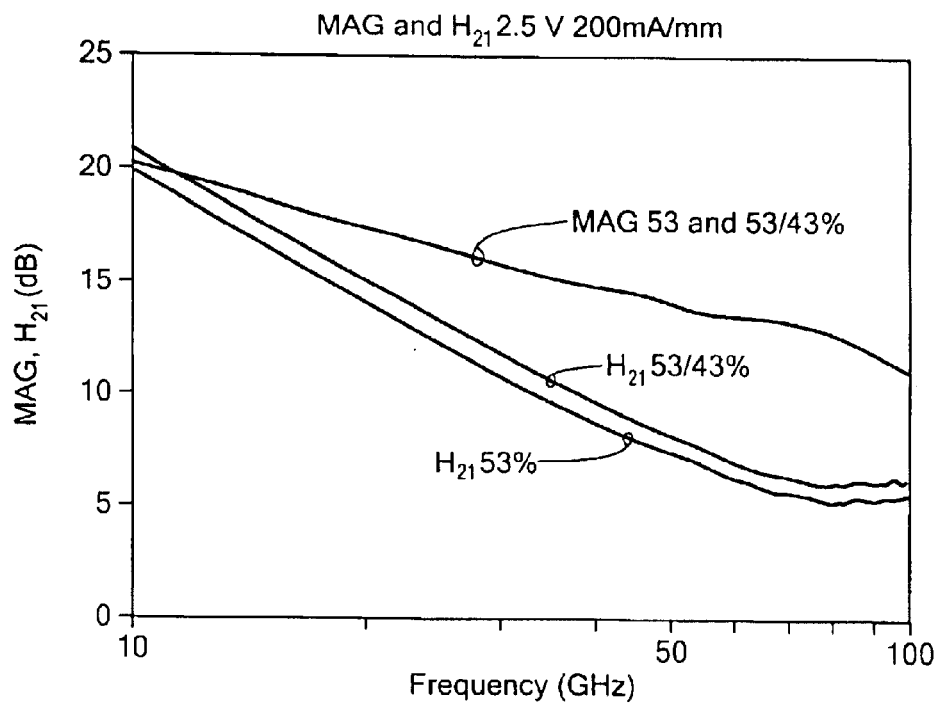
FIG. 8 are frequency response curves of the device of FIG. 1 according to the PRIOR ART and devices FIG. 4 according to the invention.
Figure 9:
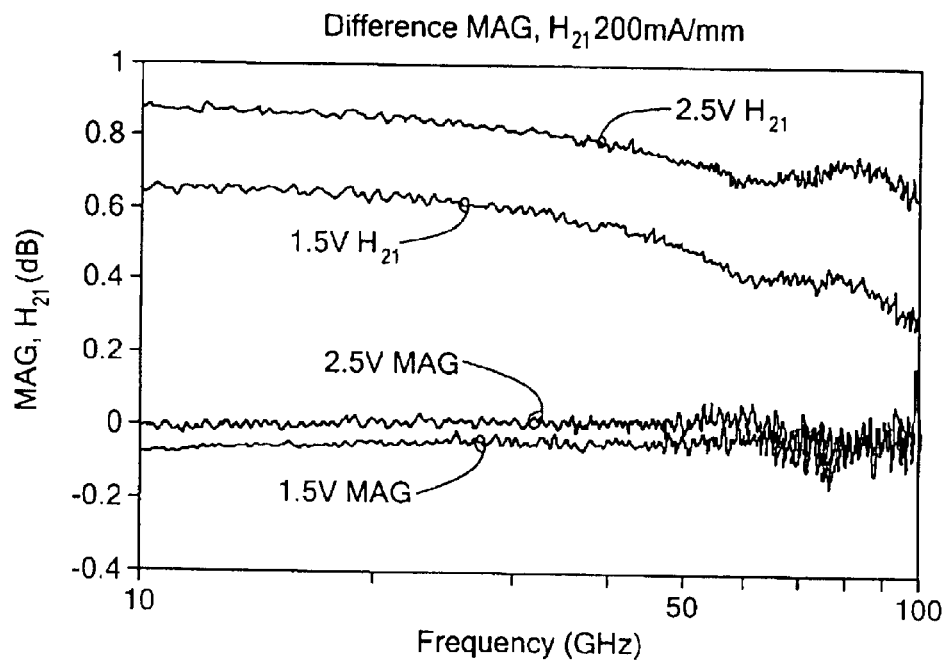
FIG. 9 are the differences between maximum available gain (MAG) and current gain (H21) of the invention and the device of FIG. 1 (prior art) measured and Vds=2.5V and 1.5V.

Hall measurements of the semiconductor layer structures of the 53% (FIG. 1) and 43/53% (i.e., device 10 in FIG. 4) MHEMTs show measured room-temperature Hall mobilities of 9624 and 9097 cm$^2$/V·S respectively. FIGS. 8 and 9 show the small-signal frequency response of the 43/53% split-channel vs. that of the 53% MHEMTs. At 95 GHz and Vds=2.5V, FIG. 8 shows both devices having a small-signal maximum available power gain (MAG) of 11.6 dB. At 95 GHz the 53% MHEMT has an $H_{21}$ of 5.6 dB while that of the 43/53% MHEMT is 6.2 dB. At a $V_{ds}$ of 2.5V and $I_{ds}$ of 200 mA/mm the current gain, $H_{21}$, of the 43/53% device is 0.6–0.8 dB higher than that for the 53% device while MAG values are nearly identical for both devices from 10–100 GHz.

FIG. 9 shows the effect of increasing $V_{ds}$ on a comparison of the 43/53% vs. 53% devices. For a $V_{ds}$ of 1.5V, $H_{21}$ of the 43/53% MHEMT exceeds that of the 53% MHEMT by 0.65 dB at 10 GHz and 0.3 dB at 100 GHz. Here the MAG of the 43/53% device is ~0.05 dB less than that of the 53% MHEMT. FIG. 9 shows the measured differences between maximum available gain (MAG) and current gain ($H_{21}$) of the invention compared against that of prior art and $V_{ds}$= 2.5V and 1.5V. For example the curve labeled "2.5V $H_{21}$" represents the $H_{21}$ (in dB) of the invention minus the $H_{21}$ of the prior art with both devices' $H_{21}$ values measured at $V_{ds}$=2.5V. Similarly, "1.5V MAG" is the invention device MAG minus that of the prior art device with both measured at $V_{ds}$=1.5V.

It is noted that, as $V_{ds}$ increases to 2.5V, the difference in MAG values goes to nearly zero while the difference in $H_{21}$ increases by about 0.2 dB across the 10–100 GHz band. In other words, as $V_{ds}$ increases the 43/53% MHEMT's advantage in gain increases in term of both $H_{21}$ and MAG. This is to be expected because, compared to the 53% MHEMT, as $V_{ds}$ increases, impact ionization electron scattering in the channel increases less rapidly in the 43/53% MHEMT giving this MHEMT an increasing advantage in electron mobility, over the 53% MHEMT, as $V_{ds}$ is increased. While the 43/53% MHEMT's frequency response advantage is minor, it does achieve the desired improvement in on-state breakdown, as defined in an article entitled "Breakdown in Millimeter-Wave Power InP HEMTs: a Comparison with PHEMTs" by J. del Alamo and M. Somerville, published in IEEE Journal of Solid-State Circuits, Vol. 34, No. 9, September 1999, pp. 1204–1211, without a penalty in frequency response relative to the 53% MHEMTs.

Figure 10:
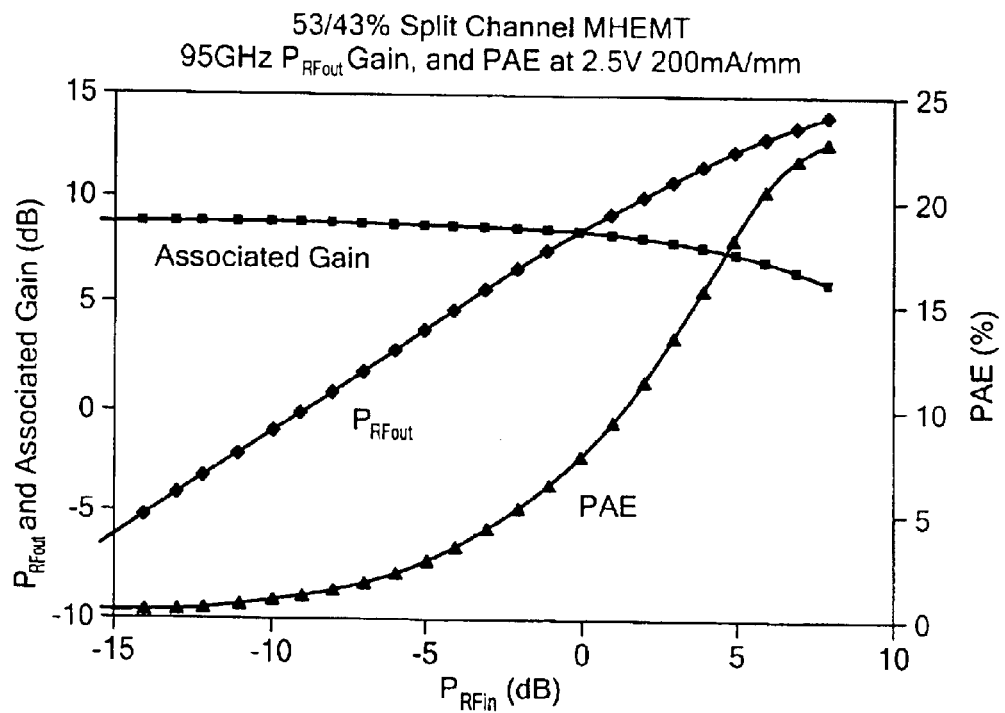
FIG. 10 shows $P_{RFout}$, PAE, and associated gain (G) curves as a function of the input RF drive power ($P_{RFin}$) for the device of FIG. 4 according to the invention.

FIG. 10 shows $P_{RFout}$, PAE, and associated gain (G) as a function of the input RF drive power ($P_{RFin}$) at 95 GHz. At the maximum PAE of 23%, $P_{RFout}$ is 13.8 dBm=24 mW or about 160 mW/mm with an associated gain of approximately 6 dB. The input RF power was set to 3 dB compression i.e. a level that reduced the gain by 3 dB relative to that with a small RF input. The 23% PAE is near state of art efficiency for any InP HEMT or MHEMT operating at or near 95 GHz. A device's gain is the ratio of output RF signal power delivered to a load resistor on the output of the device divided by the RF signal power delivered to the device's input.

A device's maximum available gain (MAG) is the maximum gain theoretically available from the device when the device is presented with optimum impedances at the input and output.

As shown here, $H_{21}$, is the magnitude of device's current gain, i.e. the ratio of the device's output signal current divided by its input signal current with the output tied to ground (set to 0V).

A number of embodiments of the invention have been described. Nevertheless, it will be understood that various modifications may be made without departing from the spirit and scope of the invention. Accordingly, other embodiments are within the scope of the following claims.

What is claimed is:

1. A transistor structure, comprising:
   a gallium arsenide (GaAs) semiconductor substrate;
   a barrier layer disposed over the substrate;
   an In$_y$Ga$_{1-y}$As lower channel layer disposed on the barrier layer, where y is the mole fraction of In content in the lower channel layer;
   an In$_x$Ga$_{1-x}$As upper channel layer disposed on the lower channel layer, where x is the mole fraction of In content in the upper channel layer and where x is different from y;
   an InAlAs Schottky layer on the In$_x$Ga$_{1-x}$As upper channel layer; and
   wherein the lower channel layer has a bandgap greater than the bandgap of the upper channel layer.

2. A transistor structure, comprising:
   a gallium arsenide (GaAs) semiconductor substrate;
   a barrier layer disposed over the substrate;

an In$_y$Ga$_{1-y}$As lower channel layer disposed on the barrier layer, where y is the mole fraction of In content in the lower channel layer;

an In$_x$Ga$_{1-x}$As upper channel layer disposed on the lower channel layer, where x is the mole fraction of In content in the upper channel layer and where x is different from y;

an InAlAs Schottky layer on the In$_x$Ga$_{1-x}$As upper channel layer and wherein the lower channel layer has a bulk electron mobility lower than the bulk electron mobility of the upper channel layer.

3. A transistor structure, comprising:

a gallium arsenide (GaAs) semiconductor substrate:

a barrier layer disposed over the substrate;

an In$_y$Ga$_{1-y}$As lower channel layer disposed on the barrier layer where y is the mole fraction of In content in the lower channel layer;

an In$_x$Ga$_{1-x}$As upper channel layer disposed on the lower channel layer, where x is the mole fraction of In content in the upper channel layer and where x is different from y;

an InAlAs Schottky layer on the In$_x$Ga$_{1-x}$As upper channel layer;

wherein the lower channel layer has a bandgap greater than the bandgap of the upper channel layer and wherein x is in the range between 0.15 and 0.90 and y is in the range between 0.0 and 0.65.

4. The transistor structure recited in claim 3 wherein x is substantially 0.53 and y is substantially 0.43.

5. A transistor structure, comprising:

a semiconductor substrate;

a barrier layer disposed over the substrate;

a lower channel layer disposed on the barrier layer;

an upper channel layer disposed on the lower channel layer, such lower channel being of the same material as the upper channel, the upper and lower channels having different mole fractions of an common element used in such upper and lower channel layers;

a Schottky layer on the upper channel layer and;

wherein the lower channel layer has a bandgap greater that than the bandgap of the upper channel layer.

6. The transistor structure recited in claim 5 wherein the substrate comprises GaAs and wherein the upper and lower channel layers comprise InGaAs.

7. The transistor structure recited in claim 6 wherein the upper and lower channel layers include indium.

8. A transistor structure, comprising:

a semiconductor substrate;

a barrier layer disposed over the substrate;

a lower channel layer disposed on the barrier layer;

an upper channel layer disposed on the lower channel layer, such lower channel being of the same material as the upper channel, the upper and lower channels having different mole fractions of an common element used in such upper and lower channel layers;

a Schottky layer on the upper channel layer and wherein the lower channel layer has a bulk electron mobility lower than the bulk electron mobility of the upper channel layer.

9. A transistor structure, comprising:

a gallium arsenide (GaAs) semiconductor substrate;

a lattice matching structure disposed over the GaAs substrate, such layer comprising InAlGaAs, such InAlGaAs having mole fractions of Al, In, and Ga of the lattice match layer gradually changing with height with a bottom portion having a lattice constant matching GaAs and a top portion having a lattice constant of the InAlAs barrier and InGaAs channel layers;

an InAlAs barrier layer disposed over the lattice match layer, an In$_y$Ga$_{1-y}$As lower channel layer disposed on the barrier layer, where y is the mole fraction of In content in the lower channel layer;

an In$_x$Ga$_{1-x}$As upper channel layer disposed on the lower channel layer, where x is the mole fraction of In content in the upper channel layer and where x is different from y; an InAlAs Schottky layer disposed on the In$_x$Ga$_{1-x}$As upper channel layer;

an InGaAs cap disposed over the InAlAs Schottky layer and;

wherein the lower channel layer has a bandgap greater than the bandgap of the upper channel layer.

10. A transistor structure, comprising:

a gallium arsenide (GaAs) semiconductor substrate;

a lattice matching structure disposed over the GaAs substrate, such layer comprising InAlGaAs, such InAlGaAs having mole fractions of Al, In, and Ga of the lattice match layer gradually changing with height with a bottom portion having a lattice constant matching GaAs and a top portion having a lattice constant of the InAlAs barrier and InGaAs channel layers;

an InAlAs barrier layer disposed over the lattice match layer;

an In$_y$Ga$_{1-y}$As lower channel layer disposed on the barrier layer, where y is the mole fraction of In content in the lower channel layer;

an In$_x$Ga$_{1-x}$As upper channel layer disposed on the lower channel layer, where x is the mole fraction of In content in the upper channel layer and where x is different from y; an InAlAs Schottky layer disposed on the In$_x$Ga$_{1-x}$As upper channel layer, an InGaAs cap disposed over the InAlAs Schottky layer and wherein the lower channel layer has a bulk electron mobility lower than the bulk electron mobility of the upper channel layer.

11. A transistor structure, comprising:

a gallium arsenide (GaAs) semiconductor substrate;

a lattice matching structure disposed over the GaAs substrate, such layer comprising InAlGaAs, such InAlGaAs having mole fractions of Al, In, and Ga of the lattice match layer gradually changing with height with a bottom portion having a lattice constant matching GaAs and a top portion having a lattice constant of the InAlAs barrier and InGaAs channel layers;

an InAlAs barrier layer disposed over the lattice match layer;

an In$_y$Ga$_{1-y}$As lower channel layer disposed on the barrier layer, where y is the mole fraction of In content in the lower channel layer;

an In$_x$Ga$_{1-x}$As upper channel layer disposed on the lower channel layer, where x is the mole fraction of In content in the upper channel layer and where x is different from y: an InAlAs Schottky layer disposed on the In$_x$Ga$_{1-x}$As upper channel layer, an InGaAs cap disposed over the InAlAs Schottky layer;

wherein the lower channel layer has a bandpap greater than the bandgap of the upper channel layer and wherein x is in the range between 0.15 and 0.90 and y is in the range between 00.0 and 0.65.

12. The transistor structure recited in claim 11 wherein x is substantially 0.53 and y is substantially 0.43.

13. A transistor structure, comprising:

a semiconductor substrate;

a lattice match layer disposed over the substrate;

an barrier layer disposed over the lattice match layer;

a lower channel layer disposed on the barrier layer;

an upper channel layer disposed on the lower channel layer, such lower channel being of the same material as the upper channel, the upper and lower channels having different mole fractions of an common element used in such upper and lower channel layers;

an Schottky layer on the upper channel layer and wherein the lower channel layer has a bandgap greater than the bandgap of the upper channel layer.

14. The transistor structure recited in claim 13 wherein the substrate comprises GaAs and wherein the upper and lower channel layers comprise InGaAs.

15. The transistor structure recited in claim 14 wherein the upper and lower channel layers include indium.

16. A transistor structure, comprising:

a semiconductor substrate:

a lattice match layer disposed over the substrate;

an barrier layer disposed over the lattice match layer;

a lower channel layer disposed on the barrier layer;

an upper channel layer disposed on the lower channel layer, such lower channel being of the same material as the upper channel, the upper and lower channels having different mole fractions of an common element used in such upper and lower channel layers;

an Schottky layer on the upper channel layer and wherein the lower channel layer has a bulk electron mobility lower than the bulk electron mobility of the upper channel layer.

17. A transistor structure, comprising:

a semiconductor substrate;

an indium aluminum arsenide (InAlAs) barrier layer disposed over the substrate;

an $In_yGa_{1-y}As$ lower channel layer disposed on the barrier layer, where y is the mole fraction of In content in the lower channel layer, an $In_xGa_{1-x}As$ upper channel layer disposed on the lower channel layer, where x is the mole fraction of In content in the upper channel layer and where x is different from y: and an InAlAs Schottky layer on the $In_xGa_{1-x}As$ upper channel layer and wherein the lower channel layer has a bandgap greater than the bandgap of the upper channel layer.

18. The transistor structure recited in claim 17 wherein the lower channel layer has a bulk electron mobility lower than the bulk electron mobility of the upper channel layer.

19. The transistor structure recited in claim 18 wherein x is in the range between 0.15 and 0.09 and y is in the range between 0.15 and 0.65.

* * * * *

UNITED STATES PATENT AND TRADEMARK OFFICE
CERTIFICATE OF CORRECTION

PATENT NO.        : 6,835,969 B1
APPLICATION NO.   : 10/606820
DATED             : December 28, 2004
INVENTOR(S)       : Philbert Francis Marsh It is certified that error appears in the above-identified patent and that said Letters Patent is hereby corrected as shown below:

Abstract, line 14 delete "channel layer where." and replace with --channel layer.--.

Column 1, line 48 delete "substrates" and replace with --substrates--.

Column 1, line 65 delete "figure" and replace with --figures--.

Column 3, line 3 delete "$P_{Rfout}$ Gain" and replace with --$P_{Rfout}$. Gain--.

Column 3, line 5 delete "would twice" and replace with --would be twice--.

Column 3, line 7 delete "0.376" and replace with --0.37υ--.

Column 3, line 8 delete "0.688." and replace with --0.68υ--.

Column 3, line 33 delete "layer" and replace with --layers--.

Column 3, line 41 delete "layer the" and replace with --layer, the--.

Column 3, line 54 delete "of high" and replace with --of a high--.

Column 4, line 9 delete "all-InGaAs" and replace with --all InGaAs--.

Column 4, line 25 delete "and on Schottky" and replace with --and a Schottky--.

Column 4, line 49 delete "that the " and replace with --than the--.

Column 4, line 56 "0.43" and replace with --0.43.--.

Column 5, line 35 delete "and device FIG. 4" and replace with --with the device of FIG. 4--.

Column 5, line 49 delete "FIG. 4 an" and replace with --FIG. 4, an--.

Column 5, line 62 delete "0.53" and replace with --0.53.--.

UNITED STATES PATENT AND TRADEMARK OFFICE
CERTIFICATE OF CORRECTION

| | | |
|---|---|---|
| PATENT NO. | : 6,835,969 B1 | Page 2 of 3 |
| APPLICATION NO. | : 10/606820 | |
| DATED | : December 28, 2004 | |
| INVENTOR(S) | : Philbert Francis Marsh | |

It is certified that error appears in the above-identified patent and that said Letters Patent is hereby corrected as shown below:

Column 6, line 21 delete "agreater" and replace with --a greater--.

Column 6, line 67 delete "layer 18, 20" and replace with --layers 18, 20--.

Column 7, line 1 delete "region the" and replace with --region, the--.

Column 7, line 13 delete "an molecular" and replace with --a molecular--.

Column 8, line 21 delete "50C" and replace with --50$\Omega$--.

Column 9, line 39 delete "layer 18, 20" and replace with --layers 18, 20--.

Column 9, line 52 delete "$GH_z$ the" and replace with --$GH_z$, the--.

Column 9, line 66 delete "For example the" and replace with --For examle, the--.

Column 10, line 27, 28 delete "Compression i.e." and replace with --compression, i.e.--.

Column 11, line 25 delete "layer and" and replace with --layer and;--.

Column 11, line 41 delete "that than the" and replace with --then the--.

Column 11, line 56 delete "layer and" and replace with --layer and;--.

Column 12, line 5 delete "layer," and replace with --layer;--.

Column 12, line 63 delete layer and" and replace with --layer and;--.

Column 13, line 13 delete "and wherein" and replace with --and;--.

Column 13, line 13 delete "layer," and replace with --layer;--.

UNITED STATES PATENT AND TRADEMARK OFFICE
CERTIFICATE OF CORRECTION

PATENT NO. : 6,835,969 B1
APPLICATION NO. : 10/606820
DATED : December 28, 2004
INVENTOR(S) : Philbert Francis Marsh It is certified that error appears in the above-identified patent and that said Letters Patent is hereby corrected as shown below:

Column 14, line 3 delete "layer and" and replace with --layer and;--.

Column 14, line 17 delete "y:" and replace with --y;--.

Column 14, line 18, delete "layer and" and replace with --y;--.

Column 14, line 26 delete "0.15 and 0.65." and replace with --0.0 and 0.65.--.

Signed and Sealed this

Sixth Day of February, 2007

JON W. DUDAS
*Director of the United States Patent and Trademark Office*

UNITED STATES PATENT AND TRADEMARK OFFICE
CERTIFICATE OF CORRECTION

PATENT NO. : 6,835,969 B1  
APPLICATION NO. : 10/606820  
DATED : December 28, 2004  
INVENTOR(S) : Philbert Francis Marsh It is certified that error appears in the above-identified patent and that said Letters Patent is hereby corrected as shown below:

Abstract, line 14 delete "channel layer where." and replace with --channel layer.--.

Column 1, line 48 delete "substrates'" and replace with --substrates--.

Column 1, line 65 delete "figure" and replace with --figures--.

Column 3, line 3 delete "$P_{Rfout}$ Gain"and replace with --$P_{Rfout}$. Gain--.

Column 3, line 5 delete "would twice" and replace with --would be twice--.

Column 3, line 7 delete "0.376" and replace with --0.37ū--.

Column 3, line 8, delete "0.688." and replace with --0.68 ū --.

Column 3, line 33 delete "layer" and replace with --layers--.

Column 3, line 41 delete "layer the" and replace with --layer, the--.

Column 3, line 54 delete "of high" and replace with --of a high--.

Column 4, line 9 delete "all-InGaAs" and replace with --all InGaAs--.

Column 4, line 25 delete "and on Schottky" and replace with --and a Schottky--.

Column 4, line 49 delete "that the " and replace with --than the--.

Column 5, line 35 delete "and device FIG. 4" and replace with --with the device of FIG. 4--.

Column 5, line 49 delete "FIG. 4 an" and replace with --FIG. 4, an--.

Column 5, line 62 delete "0.53" and replace with --0.53.--.

Column 6, line 21 delete "agreater" and replace with --a greater--.

Column 6, line 67 delete "layer 18, 20" and replace with --layers 18, 20--.

Column 7, line 1 delete "region the " and replace with --region, the--.

UNITED STATES PATENT AND TRADEMARK OFFICE
CERTIFICATE OF CORRECTION

PATENT NO. : 6,835,969 B1
APPLICATION NO. : 10/606820
DATED : December 28, 2004
INVENTOR(S) : Philbert Francis Marsh It is certified that error appears in the above-identified patent and that said Letters Patent is hereby corrected as shown below:

Column 7, line 13 delete "an molecular" and replace with --a molecular--.

Column 8, line 21 delete "50C" and replace with --50Ω--.

Column 9, line 39 delete "layer 18, 20" and replace with --layers 18, 20--.

Column 9, line 52 delete "$GH_z$ the" and replace with --$GH_z$, the--.

Column 9, line 66 delete "For example the" and replace with --For example, the--.

Column 10, line 27-28 delete "Compression i.e." and replace with --compression, i.e.--.

Column 11, line 25 delete "layer and" and replace with --layer and;--.

Column 11, line 41 delete "that than the" and replace with --then the--.

Column 11, line 56 delete "layer and" and replace with --layer and;--.

Column 12, line 5 delete "layer," and replace with --layer;--.

Column 12, line 63 delete "layer and" and replace with --layer and;--.

Column 13, line 13 delete "and wherein" and replace with --and;--.

Column 13, line 13 delete "layer," and replace with --layer;--.

Column 14, line 3 delete "layer and" and replace with --layer and;--.

Column 14, line 17 delete "y:" and replace with --y;--.

Column 14, line 18 , delete "layer and" and replace with --y;--.

UNITED STATES PATENT AND TRADEMARK OFFICE
CERTIFICATE OF CORRECTION

PATENT NO. : 6,835,969 B1
APPLICATION NO. : 10/606820
DATED : December 28, 2004
INVENTOR(S) : Philbert Francis Marsh It is certified that error appears in the above-identified patent and that said Letters Patent is hereby corrected as shown below:

Column 14, line 26 delete "0.15 and 0.65." and replace with --0.0 and 0.65.--.

Signed and Sealed this

Twenty-seventh Day of February, 2007

JON W. DUDAS
*Director of the United States Patent and Trademark Office*